United States Patent [19]

Vieweg et al.

[11] 4,229,795
[45] Oct. 21, 1980

[54] ELECTRONIC MAXIMUM MEASURING DEVICE

[75] Inventors: Gunther Vieweg, Nuremberg; Wilhelm Stürzl, Winkelhaid, both of Fed. Rep. of Germany

[73] Assignee: Siemens Aktiengesellschaft, Munich, Fed. Rep. of Germany

[21] Appl. No.: 952,291

[22] Filed: Oct. 18, 1978

[30] Foreign Application Priority Data

Oct. 21, 1977 [DE] Fed. Rep. of Germany ....... 2747406

[51] Int. Cl.² ........................................... G01R 11/64
[52] U.S. Cl. ........................... 364/483; 364/464; 235/92 EL; 324/103 R; 324/116
[58] Field of Search ...................... 364/483, 493, 464; 235/92 MT, 92 EL; 324/103 R, 142, 116; 307/31

[56] References Cited

U.S. PATENT DOCUMENTS

| | | | |
|---|---|---|---|
| 3,505,508 | 4/1970 | Leyde | 324/103 R |
| 3,517,310 | 6/1970 | Gates et al. | 364/483 |
| 3,747,068 | 7/1973 | Bruner et al. | 364/483 |
| 3,998,093 | 12/1976 | Bertolasi | 364/483 |
| 4,120,031 | 10/1978 | Kincheloe et al. | 364/483 |
| 4,125,895 | 11/1978 | Buhlmann | 364/483 |

Primary Examiner—Charles E. Atkinson
Assistant Examiner—Gary Chin
Attorney, Agent, or Firm—Kenyon & Kenyon

[57] ABSTRACT

In a device for measuring maximum energy consumption over a fixed period, a shift register and up-down counter are used to establish a sliding period and the maximum energy over that sliding period stored.

2 Claims, 2 Drawing Figures

ELECTRONIC MAXIMUM MEASURING DEVICE

BACKGROUND OF THE INVENTION

This invention relates to electronic measuring devices in general and more particularly to an improved device for measuring energy consumption.

Electronic watt-hour meters which are capable of measuring a maximum peak power over a predetermined time period, for example, 15 minutes, have been developed. In order to permit power companies to supply a level load, and also to have generating capability to supply all consumers at all times, it is necessary that peak loads be predictable. Thus, there is a practice of billing large users, in particular, based on a peak load within a given period of time, typically 15 minutes. This gives the user an incentive to maintain a level load and not exceed a predetermined peak. In some such devices, pulses are obtained from a watt-hour meter having a rotor disk adapted to supply a plurality of electrical pulses. The pulses are counted for a period of time determined by a time base which is typically generated by the line frequency. The pulses developed from the line frequency are counted in a counter and when the count reaches a number of corresponding to the predetermined time of measurement, the number of pulses counted in a further counter are compared with the previous maximum and a memory location, such as in a register, updated if the new maximum has exceeded the previous one. Typically, such devices are also fed further information such as rate switching commands, on and off commands, monthly resetting commands and network failure signals. Devices of this nature which utilize individual hardward elements have been developed as have devices utilizing microcomputers. Typical of the latter is the type disclosed in German Offenlegungsschrift No. 26 13 112. Naturally, by using the microcomputer a greater degree of flexibility is possible. In addition, in order to let the customer know how he is doing, and to permit him to reduce his loads if he is using too much power in a given period, displays are normally associated with such devices.

SUMMARY OF THE INVENTION

It is the object of the present invention to further perfect an electronic maximum measuring device of the general type mentioned above without a substantial increase in cost. Furthermore, it is an object of the present invention to provide such a measuring device which can be implemented either in hardware or in a microcomputer. With respect to the microcomputer, as present the cost of such computers does not justify their use for this purpose, the addition of capabilities to the system without increase in cost can go a long way to making such economical.

In accordance with the present invention, a system is provided in which there is not only a fixed measuring period over which the maximum is determined, but also a sliding measuring period which is obtained without significant additional hardware. In fact, if implemented using a microcomputer, the additional hardware is minimal. Basically, the sliding measuring period is obtained through the use of a shift register which is clocked in conventional fashion at a rate at least equal to the maximum rate out of the meter. The shift register receives input pulses from the meter which are fed as the down count to an up-down counter which has its up count input coupled to the meter output. The number of stages in the shift register determine the length sliding period. If, for example, power is being consumed at a constant rate, assuming everything was reset, the counter will count up to a certain count, while at the same time data is being shifted through the shift register stages. When data reaches the last stage of the shift register it will be transferred to the down count of the counter. When operating at a constant rate this will mean that a down count will occur for each up count and the counter output will remain constant. In effect the counter, in operation, will represent the mean value of power consumption over the sliding period determined by the shift register. For example, if the shift register is set to represent 15 minutes, the value will represent power consumption over the immediately previous 15 minutes. Thus, if a user operates at 5 KW, for the first half of a fixed period of 15 minutes, at 10 KW for the next half and then remains at 10 KW for the first half of the next fixed period, the fixed period mean maximum will be 7.5 KW. But, the sliding 15 minute period will register the fact that he operated at 10 KW for 15 minutes. In this way the user can be prevented from defeating the purpose of this type of monitoring.

DETAILED DESCRIPTION OF THE INVENTION

Figure 1:
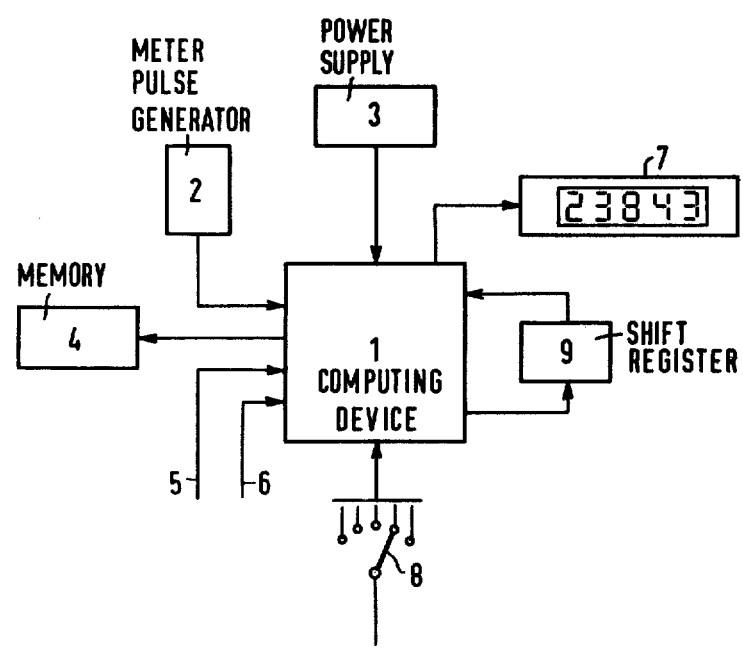
FIG. 1 is a block diagram of the system of the present invention.

FIG. 1 illustrates in block diagram form a system according to the present invention. A meter pulse generator 2 supplies pulses to a computing device 1. The pulse rate will, of course, be proportional to the rate of power consumption. The device 1 will include a power supply 3 in conventional fashion. Also associated with device 1 is a memory 4, which is preferably a nonvolatile memory so that it will maintain the highest maximum accured even in the event of a power failure. Also included is a line 5 for supplying a monthly reset signal and a line 6 for feeding in a measuring period. The computing device 7 provides an output to a seven segment display 7. By means of a selector switch 8, any one of a number of stored values may be displayed on the display. For example, if the measuring period is 15 minutes, in one position of the switch, the maximum for 15 minutes can be displayed. Another display might be the instantaneous power consumption and another, the maximum over a six month or a twelve month period. In addition, means can be provided to supply outputs indicating the cumulative amount of power used for the month, for example. Such a device is disclosed in detail in German Offenlegungsschrift No. 26 13 112. The other aspects of the system, i.e., the storing of cumulative values and so forth, is not directly related to the present invention. The present invention relates primarily to the portions of the computing device which determine and store maximum values over a measuring period. In accordance with the present invention, there is provided in addition to the prior art equipment, a shift register 9. The manner in which the shift register operates will best be understood with reference to FIG. 2 which shows a portion of the system of FIG. 1, specifically, the portion which determines the maximum consumption over predetermined periods.

Figure 2:
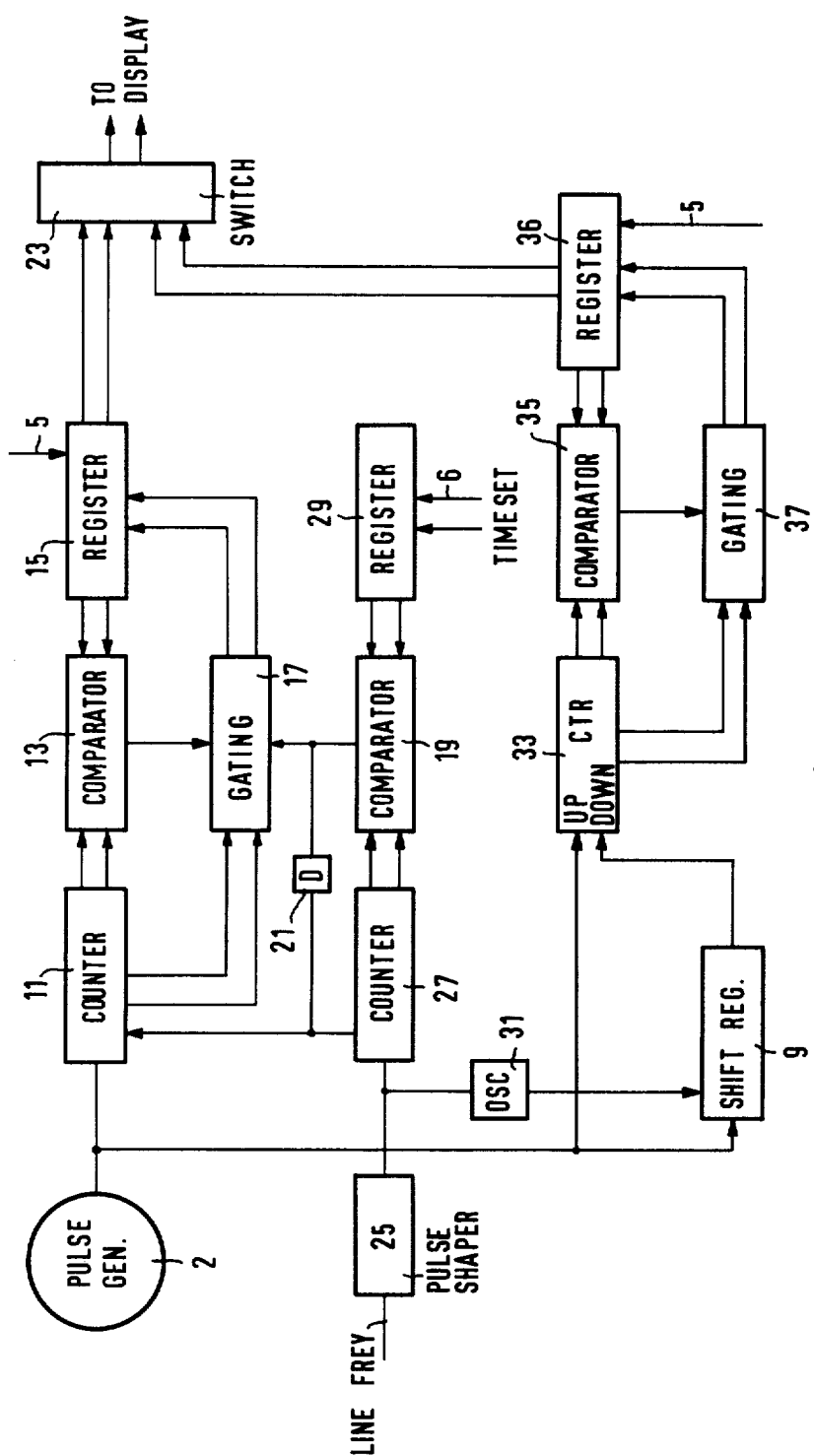
FIG. 2 is a detailed drawing of one implementation of the apparatus of the present invention.

As illustrated on FIG. 2, the output of the meter pulse generator 2 is the input to a counter 11 which accumulates pulses, and in which the count stored therein is thus an integration of the instantaneous power usage. The outputs of the counter are provided as inputs to a comparator 13 having its second inputs from a register 15 which forms part of the memory 4 of FIG. 1. The counter outputs are also supplied to a gating module 17 which contains a plurality of AND gates. Each AND gate will have as inputs an output from comparator 13, an output from a comparator 19 to be described below, and one of the output lines of the counter. The output from comparator 19 indicates the end of the predetermined measuring period of fixed duration, e.g., the end of a 15 minute period. At the end of this period, if there is an output from comparator 13 indicating that the count in counter 11 is greater than the quantity stored in register 15, the gating is enabled and the output of the counter 11 is transferred to the register 15 to store a new maximum value.

Through a delay 21, to permit updating the register, the counter 11 is then reset for the next period. Also shown as an input to the register 15 is a line 5, which is used to reset the register at the end of the month after the monthly maximum reading has been obtained. The output of the register is also provided to a switch 23 corresponding to the switch 8 of FIG. 1, which permits supplying it to the display 7 of FIG. 1.

In order to determine the predetermined time period, the line frequency is coupled through a pulse shaper 25 into a counter 27. The desired time period is set into a register 29 using the line 6. When the count in the counter equals the value stored in the register 29, indicating that the predetermined time has been reached, an output is generated from the comparator 19 to enable the gating 17 to respond if comparator 13 has also responded. The output of the delay means 21 is also used to reset the counter 27.

The output of the pulse shaper 25 is used to drive an oscillator 31 which provides a clock frequency for the shift register 9. The shift register receives its input from the meter pulse generator 2. Thus, the pulses which appear at the input of the shift register are clocked therethrough and, after a number of clock pulses equal to the number of stages in the shift register, appear at its output. This output is the down input to an up-down counter 33 which receives its up input from the meter pulse generator 2. The counter thus contains the mean instantaneous value of power consumption averaged over a period determined by the number of stages in the shift register and the frequency of the oscillator 31. This period is of a fixed length but, unlike the fixed period of the prior art which begins and ends at a certain time, slides and thus represents the maximum over the last 15 minutes, for example.

The output of the counter 33 can also be coupled directly into the switch 23 to provide an output indicative of this instantaneous value. In order to record the maximum consumption over this variable period established by the shift register 9 and oscillator 31, the output of the counter 33 is provided to a comparator 35 receiving its input from a register 36, again part of the memory 4 of FIG. 1. Since the counter 33 is constantly changing, it is desired to update the register 36 anytime the maximum therein exceeds the previously stored maximum. Thus, whenever the comparator 35 indicates that the maximum in the counter has exceeded the stored maximum it enables gating 37 to transfer the counter value into the register 36 to establish a new maximum value. Register 36 can be reset by the line 5 in the same manner as register 15.

The implementation illustrated in connection with FIG. 2 operates with individual hardware elements. However, it will be recognized by those skilled in the art that all of the computations which are carried out by the apparatus of FIG. 2 can equally well be carried out in a microcomputer. In such a case, an appropriate register or memory location within the microprocessor would be incremented with each pulse output of the meter and decremented with outputs from the shift register. Thus, internally, within the microprocessor, the same information as is stored in the counter 33 would be present. Naturally, the various comparisons which are required to determine the maximums can be carried out in simple fashion using the microprocessor instructions.

What is claimed is:

1. In a device for measuring maximum energy consumption which includes a computing device for computing the energy consumption over a fixed period of time, a non-volatile memory for storing the maximum value of energy within any one of successive fixed periods and means to store as a new value in said memory any computed value which exceeds that previously stored, said computing device being supplied with pulses representing energy consumption, the improvement comprising:

(a) means in said computing device for simultaneously computing the energy consumption over a sliding measuring period in addition to computing the energy consumption over the predetermined fixed period of time comprising:
  (i) means for generating a clock signal;
  (ii) a shift register having the pulses representing energy consumption as a data input and the said clock signal as a clock input; and
  (iii) means for storing a pulse count, responsive to said pulses to increase its count and responsive to the output of said shift register to decrement said count, whereby the stored count will represent a mean value over a sliding period determined by said clock rate and shift register length;

(b) means in said non-volatile memory for also storing the maximum value of energy within said sliding period, in addition to storing the maximum value of energy within any one of the successive fixed periods; and (c) means for also transferring into said non-volatile memory, as a new value of said maximum over said sliding period, any computed value occurring in said means for storing a pulse count during said sliding period which exceeds that previously stored as the maximum during said sliding period.

2. The improvement according to claim 1 and further including a display and means to alternately supply to said display the maximum over said fixed period and the maximum over said sliding period.

* * * * *